United States Patent [19]
Lauruhn

[11] Patent Number: 5,642,263
[45] Date of Patent: Jun. 24, 1997

[54] CIRCUIT BOARD RETENTION SYSTEM

[75] Inventor: Jeff Lauruhn, Folsom, Calif.

[73] Assignee: Intel Corporation, Santa Clara, Calif.

[21] Appl. No.: 689,698

[22] Filed: Aug. 16, 1996

[51] Int. Cl.$^6$ ................................................ H05K 7/14
[52] U.S. Cl. .................... 361/801; 361/740; 361/802; 439/157; 439/328; 211/41.17
[58] Field of Search ........................... 361/801, 736–737, 361/740, 741, 747, 748, 756, 759, 802, 829, 796, 727; 211/41, 47; 439/328, 157, 153, 155

[56] References Cited

U.S. PATENT DOCUMENTS

| | | | |
|---|---|---|---|
| 4,648,009 | 3/1987 | Beun et al. | 361/759 |
| 5,030,108 | 7/1991 | Babow | 439/157 |
| 5,317,483 | 5/1994 | Swindler | 361/801 |

Primary Examiner—Leo P. Picard
Assistant Examiner—Anthony Dinkins
Attorney, Agent, or Firm—Blakely, Sokoloff, Taylor & Zafman

[57] ABSTRACT

An apparatus for retaining a circuit board in a connected position is constituted with a top cover and a U-shaped retention body. The top cover has pivoting features disposed at one end and locking features disposed at the other end. The U-shaped retention body has a base and a cavity disposed therein, and two arms rising from each side end. The rising arms include receiving features correspondingly disposed on their top ends. The top cover pivoting features mate with one the receiving features to allow the top cover to pivot at one of the top ends, placing the apparatus in an open position for inserting the circuit board into the cavity, and in a closed position, with the locking features mating with the other receiving feature, securing the inserted circuit board.

9 Claims, 5 Drawing Sheets

CIRCUIT BOARD RETENTION SYSTEM

BACKGROUND OF THE INVENTION

1. Field of the Invention

The present invention relates to the field of electronic system packaging. More specifically, it relates to an apparatus for mechanically stabilizing and retaining a circuit board connected to a backplane of an electronic system, e.g. a daughter card connected to a motherboard of a desktop computer.

2. Background Information

For a variety of reasons, including but not limited to interchangeability and expandability, most electronic systems, whether analog or digital, typically are modular in design. Different aspects or functions of a system are implemented on different circuit boards, thus allowing systems of varying degrees in functionality to be easily put together by including or excluding certain circuit boards. It also allows systems to be easily upgraded with additional functions by adding or replacing certain circuit boards.

Very often, one of the circuit boards is considered to be the main circuit board, against which all the other circuit boards are connected. The main circuit board is often referred to as the backplane or the motherboard, whereas the other circuit boards are often referred to as the add-on boards/cards or daughter cards. For example, in the case of personal computers, traditionally, the circuit board where the main components such as the processor and the memory are mounted is considered the motherboard. The expansion or optional functions, such as serial/parallel interfaces, game adapters, graphics and/or video adapters, network adapters, and modems, are implemented using add-on/daughter cards, which are connected to the expansion slots or connectors of the motherboard. However, in recent years, the role of the expansion slots/connectors is beginning to blur, as manufacturers begin to package processors and memory components on daughter cards.

In order for a system to operate properly, the connections between the add-on/daughter cards and the motherboard must be kept unbroken. This is generally not a problem during normal operation. However, when a system is moved or otherwise exposed to mechanical shock and vibration, the connections may become disengaged. The mechanical shock and vibration may come in any number of directions including but not limited to the direction parallel to the motherboard or the direction parallel to the add-on/daughter cards.

A number of approaches have been devised by system manufacturers to address this problem. At one end of the spectrum, the backplane/motherboard and the add-on/ daughter cards are housed in a rigid mechanical structure called a card cage, which provides a frame to which daughter cards are attached by clips or screws. This is an effective but expensive solution. At the other end of the spectrum, many I/O add-on cards are retained by providing a bracket at one side edge of the circuit board, and securing the bracket against the rear frame of the system chassis. This is an inexpensive solution. However, it is not suitable for daughter cards that have high rigidity or stability requirements, or daughter cards that are "centrally" located, away from the chassis, e.g. a processor daughter card.

In between, a number of approaches are employed to provide the desired increased rigidity and stability, but without substantial increase in cost. For example, U.S. Pat. No. 5,162,979 disclosed an approach of using two pivotal levers and complementary fulcrums to secure the opposing side edges of a daughter card. The pivotal levers are mounted on opposing ends of the top edge of a daughter card, and the fulcrums are mounted on the two opposing frames of the system chassis. This is also an inexpensive solution. However, it is not suitable for daughter cards that are "centrally" located, away from the chassis, or daughter cards that do not span the entire length/width of the chassis.

Thus, it is desirable to have a circuit board retention apparatus that can offer increased rigidity and stability, but without the cost of the card cage approach, nor requiring the circuit board to span the entire length/width of the chassis. As will be described in more detail below, the circuit board retention apparatus of the present invention achieves these and other desirable results.

SUMMARY OF THE INVENTION

An apparatus for retaining a circuit board in a connected position is constituted with a top cover and a U-shaped retention body. The top cover has pivoting features disposed at one end and locking features disposed at the other end. The U-shaped retention body has a base with a cavity disposed therein, and two arms rising from each side end. The rising arms have receiving features correspondingly disposed on the top ends. The top cover pivoting features mate with one the receiving features to allow the top cover to pivot at one of the top ends, placing the apparatus in an open position for inserting the circuit board into the cavity, and in a closed position, with the locking features mating with the other receiving feature, securing the circuit board.

In one embodiment, the pivoting features include a hinge, and the locking features include a number of flexible protruding fingers with hooked end. The first top end is "μ" shaped (cut away view), whereas the second top end includes a number of hook-stops. The base and the top covers are made of a unibody construction, and manufactured by injection molding, using glass filled polycarbonate.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
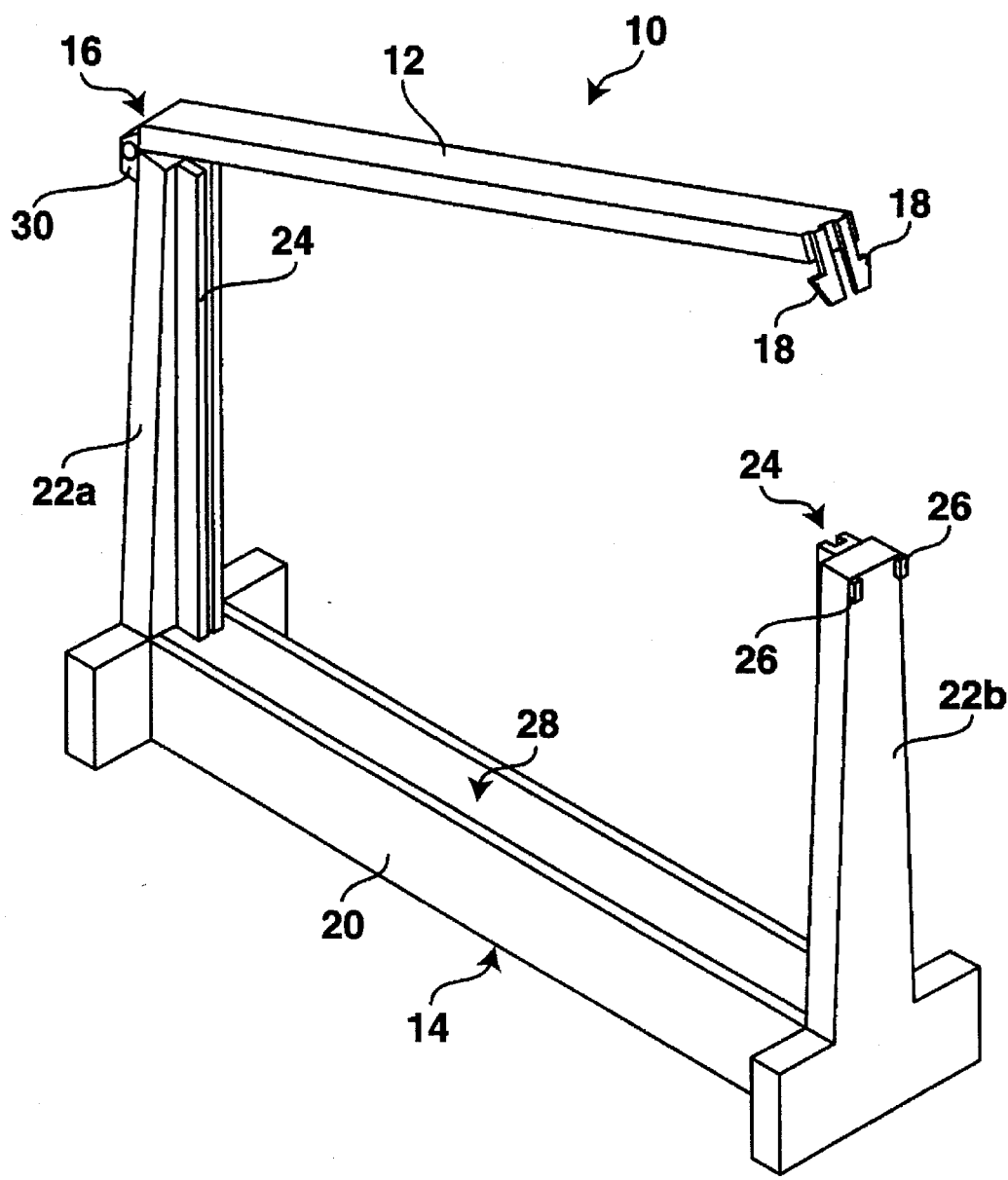
FIGS. 1–2 are two perspective views of one embodiment of the circuit board retaining apparatus of the present invention.

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Referring now to the figures, the circuit board retention apparatus of the present invention 10 is illustrated from various views. Circuit board retention apparatus 10 includes top cover 12 and retention body 14. Top cover 12 pivots at the top end of arm 22a of retention body 14 placing apparatus 10 in an open position (as illustrated by FIGS. 12) for inserting the circuit board to be retained (not shown) into cavity 28 of retention body 14, and in a closed position, with the other end of top cover 12 engaging the top end of arm 22b, securing the inserted circuit board in place.

In one application, the circuit board is a processor daughter card of a computer system having a processor disposed thereon, and a number of electrical connection pins disposed along one edge, for mating with a connector disposed on a mother board of the computer system.

As illustrated, top cover 12 includes pivoting features at the end where top cover 12 is to pivot at the top end of arm 22a. For the illustrated embodiment, the pivoting features include a hinge disposed at that end of top cover 12. At the opposite end, top cover 12 includes certain locking features for engaging the top end of arm 22b. For the illustrated embodiment, the lock features include protruding fingers 18 having hooked ends. Protruding fingers 18 are flexible, thereby allowing them to bending "inwards", towards each other, as they mate with the complementary locking features disposed at the top end of arm 22b.

For the illustrated embodiment, top cover 12 is longitudinal in shape. It is sized in a complementary manner to the width of the circuit board to be retained. For the illustrated embodiment, it has a uni-body construction formed by injection molding, using polycarbonate.

Figure 2:
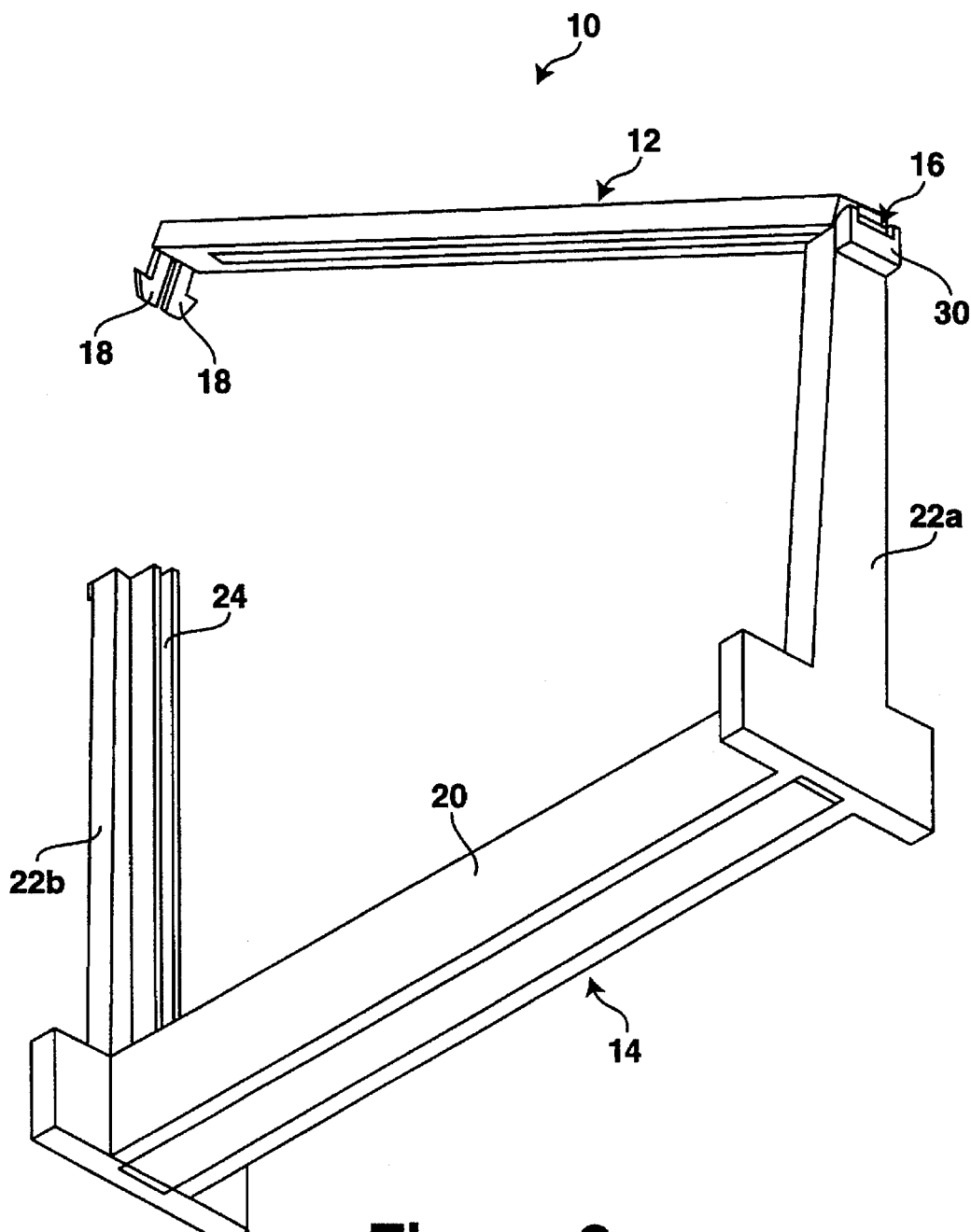
Figure 3:
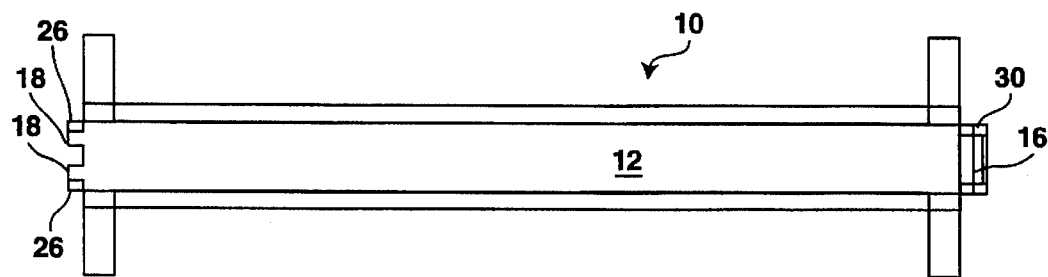
FIG. 3 is a top view of the same embodiment of the circuit board retaining apparatus of the present invention.

Retention body 14 includes base 20 having cavity 28 disposed therein, and arms 22a and 22b rising from the two sides. In other words, retention body 14 is substantially U-shaped. Cavity 28 is geometrically shaped and sized to allow retention body 14 to be placed over the connector against which the circuit board is to be mounted. Arm 22a includes cup like protrusion 30 at its top end for receiving and snugly holding the pivoting features of top cover 12. In other words, viewing apparatus 10 with arm 22a as the right arm (as in FIG. 2), the cut away view of arm 22a resembles the Greek letter "µ". Arm 22b includes hook stops 26 at its top end, for mating with fingers 18 to keep top cover 12 engaged with retention body 14. While in this engaged position, top cover 12 exerts a downward force on the circuit board being retained, keeping the circuit board engaged to the connector inside cavity 28. Additionally, both arms 22a and 22b include channels 24 in their respective "inside" face, for guiding the insertion of the circuit board being retained. The height of arms 22a and 22b are sized in a complementary manner to the height of the circuit board.

Figure 4:
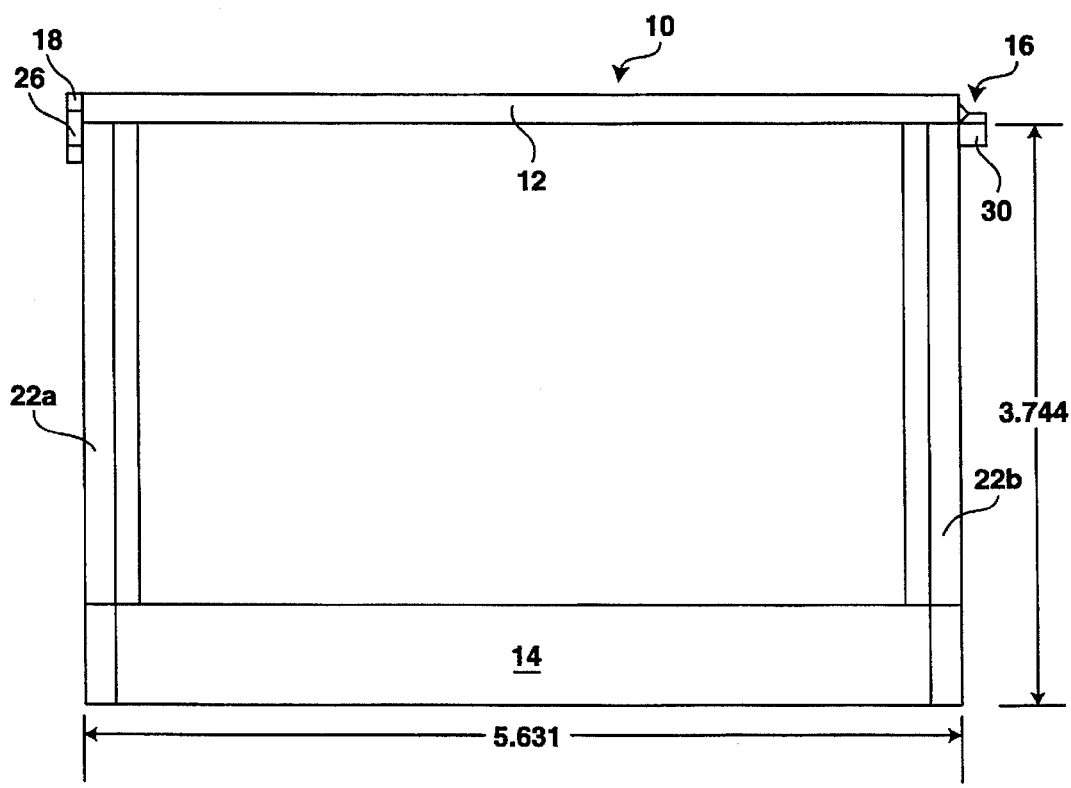
FIG. 4 is a front view of the same embodiment of the circuit board retaining apparatus of the present invention.
Figure 5:
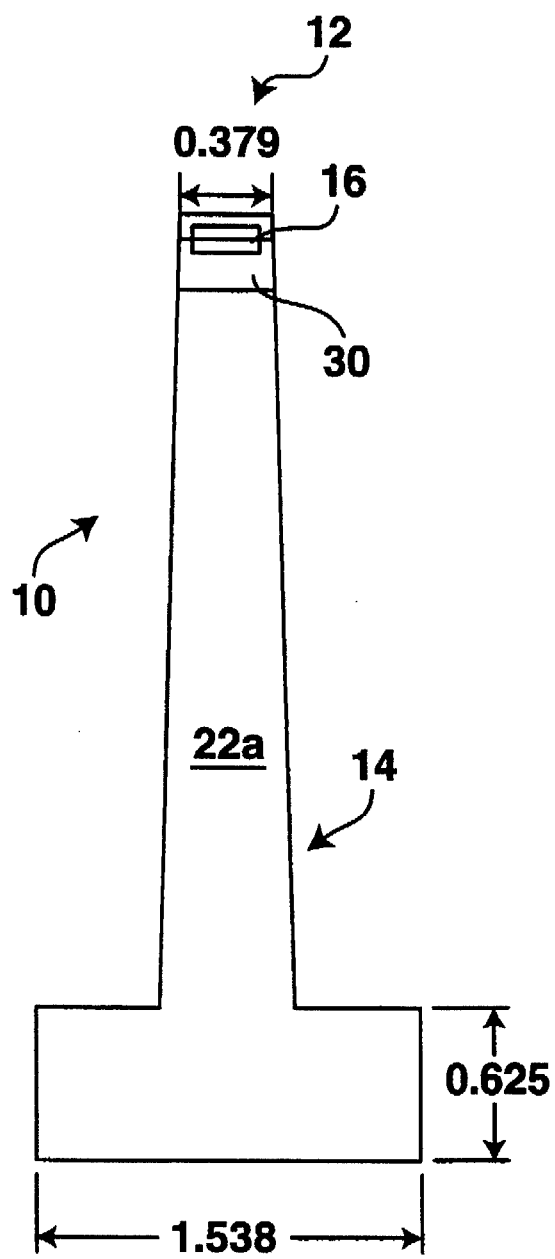
FIG. 5 is a side view of the same embodiment of the circuit board retaining apparatus of the present invention.
Figure 6:
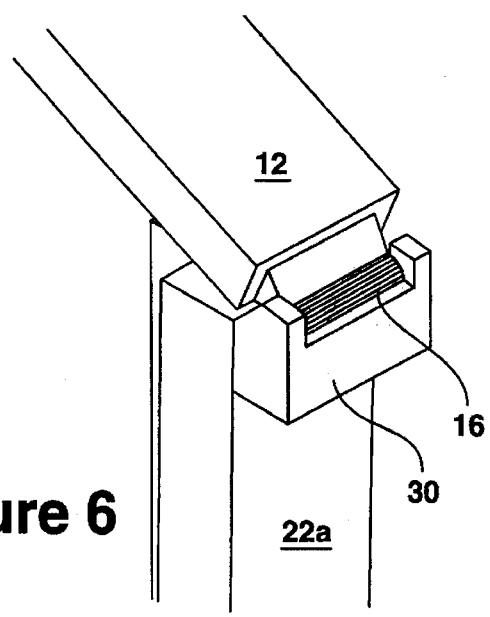
FIG. 6 is a zoom-in view of the hinged end of the top cover of the same embodiment of the circuit board retaining apparatus of the present invention.
Figure 7:
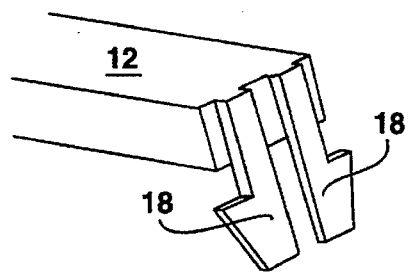
FIG. 7 is a zoom-in view of the fingered end of the top cover and the stopped end of the corresponding arm of the base of the same embodiment of the circuit board retaining apparatus of the present invention.
Figure 7:
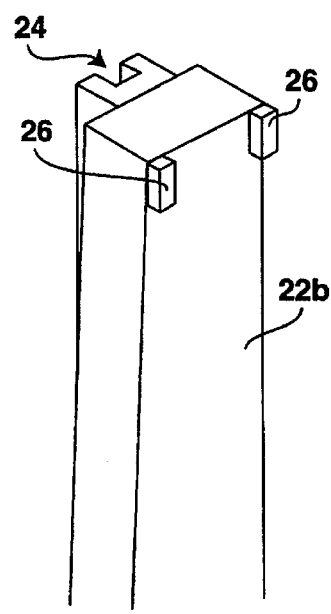

As will be appreciated by those skill in the art, the materials used, and the precise dimensions of the various aspects of retention body 14, such as the length of arms 22a and 22b, the length of base 20, so forth, are functionally dependent on the size of the circuit board to be retained, and the amount of shock and vibration circuit board retention apparatus 10 needs to overcome. In one application for a processor daughter card having dimensions of 2.25 in×5 in×0.062 in, the amount of shocks and vibrations apparatus 10 is required to overcome are 100 G for 6 ms duration in sawtooth waveform for shock, and 50–2000 HZ, 9 grms, and 15 min/axis for vibration, the materials used are glass filled polycarbonate for top cover 12 and retention body 14. Selected dimensions for apparatus 10 are illustrated in FIGS. 4–5.

Thus, an apparatus for cost effectively retaining a circuit board in a connected position has been described. While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus for securely retaining a circuit board in a connected position, said apparatus comprising:

a) a top cover having pivoting features and locking features disposed at a first and a second end of the top cover; and b) a retention body having a base with a cavity disposed therein, a first and a second arm rising respectively from a first and a second side end of the base, the first and second arms having a first and a second receiving feature correspondingly disposed at a first and a second top end of the first and second arms, the first receiving feature mating with the pivoting features of the top cover to allow the top cover to pivot at the first top end, placing the apparatus in an open position for the circuit board to be inserted into the cavity, and in a close position with the locking features engaging the second receiving feature, securing the circuit board.

2. The apparatus as set forth in claim 1, wherein the pivoting features include a hinge.

3. The apparatus as set forth in claim 1, wherein the locking features include a plurality of flexible protruding fingers having hooked ends.

4. The apparatus as set forth in claim 3, wherein the second top end of the second arm include a plurality of hook-stops for mating with the hooked ends of the flexible protruding fingers.

5. The apparatus as set forth in claim 1, wherein the first top end of the first arm is shaped as the Greek letter "µ" in a cut away view.

6. The apparatus as set forth in claim 1, wherein each of said first and second arms further includes a channel disposed on an inside surface of the arm for slidably receiving an edge of the inserting circuit board.

7. The apparatus as set forth in claim 1, wherein at least either the top cover or the base is formed of uni-body construction by injection molding.

8. The apparatus as set forth in claim 1, wherein at least either the top cover or the base is made of polycarbonate.

9. The apparatus as set forth in claim 1, wherein said circuit board is a processor daughter card of a computer system.

* * * * *